(12) United States Patent
Yun et al.

(10) Patent No.: US 8,531,720 B2
(45) Date of Patent: Sep. 10, 2013

(54) PROCESSING IMAGE DATA

(75) Inventors: Kwan-Soo Yun, Suwon-si (KR); Ved Prakash Anand, Karnataka (IN); Sang-Do Cho, Seongnam-si (KR); Ro-Woon Lee, Seoul (KR); Jae-Woo Joung, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1092 days.

(21) Appl. No.: 12/480,240

(22) Filed: Jun. 8, 2009

(65) Prior Publication Data

US 2010/0014105 A1 Jan. 21, 2010

(30) Foreign Application Priority Data

Jul. 21, 2008 (KR) .................. 10-2008-0070761

(51) Int. Cl.
*G06F 15/00* (2006.01)
*G06K 1/00* (2006.01)
*H04N 1/60* (2006.01)

(52) U.S. Cl.
USPC ............. 358/1.9; 358/21; 358/3.27; 382/266; 382/268

(58) Field of Classification Search
USPC ......................................................... 358/1.9
See application file for complete search history.

(56) References Cited

U.S. PATENT DOCUMENTS

| | | | | |
|---|---|---|---|---|
| 4,935,821 A * | 6/1990 | Sano et al. | ..................... | 358/401 |
| 5,050,228 A * | 9/1991 | Yoshida et al. | ............... | 382/256 |
| 2005/0018227 A1* | 1/2005 | Takahashi et al. | ............. | 358/1.9 |
| 2006/0203023 A1* | 9/2006 | Tatsumi | .......................... | 347/15 |

* cited by examiner

*Primary Examiner* — Marivelisse Santiago Cordero
*Assistant Examiner* — Aaron R Gerger
(74) *Attorney, Agent, or Firm* — McDermott Will & Emery LLP

(57) ABSTRACT

A method of processing image data according to an embodiment of the present invention includes: setting a permissible pitch range for a distance between adjacent ink blots; arranging image data for the line pattern in an x-y coordinate system; selecting a first base point corresponding to one side of the image data for the line pattern; selecting a first determination point from the first base point, in which the first determination point is parallel to and separated from one side of the image data for the line pattern; determining whether a distance between the first base point and the first determination point is within the permissible pitch range; and storing a coordinate as print data if the distance between the first base point and the first determination point is within the permissible pitch range, in which the coordinate is located at a shortest distance from the first determination point.

14 Claims, 11 Drawing Sheets

PROCESSING IMAGE DATA

CROSS-REFERENCE TO RELATED APPLICATIONS

This application claims the benefit of Korean Patent Application No. 10-2008-0070761, filed with the Korean Intellectual Property Office on Jul. 21, 2008, the disclosure of which is incorporated herein by reference in its entirety.

BACKGROUND

1. Technical Field

The present invention relates to a method of processing image data and a recorded medium tangibly embodying the method.

2. Description of the Related Art

Currently, the inkjet printing technology is widely used, not only in office applications but also in industrial applications. One such example is the use of inkjet printing in processes for manufacturing a printed circuit board (PCB).

A printed circuit board may generally be designed using layout software, where the design may include various shapes (for example, wide lines, circles, arcs, polygons, hollow circles, and interconnections). In printing these various shapes, an inkjet printer may eject ink droplets, which may form ink blots having a circular shape.

Since the inkjet printer may operate based on a raster image format, the various shapes may have to be filled with simulated ink blots, i.e. circles, and then saved as an image file format.

In order to ensure smoothness and avoid empty areas and thus provide the resolution and ink density required by the user, it is needed to carefully place the ink blots along the boundaries and inside the shapes that are to be printed.

SUMMARY

The present invention provides a method of processing image data and a recorded medium tangibly embodying a set of instructions for implementing the method, which can be utilized to print pads with a high level of surface smoothness and reliability.

An aspect of the present invention provides a method of processing image data and a recorded medium tangibly embodying the method. According to an embodiment of the present invention, the method of processing image data to obtain image data for printing a line pattern by discharging ink blots having a radius of r in an overlapping manner can include setting a permissible pitch range for a distance between adjacent ink blots, arranging image data for the line pattern in an x-y coordinate system, selecting a first base point corresponding to one side of the image data for the line pattern, selecting a first determination point from the first base point, in which the first determination point is parallel to and separated from one side of the image data for the line pattern, determining whether a distance between the first base point and the first determination point is within the permissible pitch range, and storing a coordinate as print data if the distance between the first base point and the first determination point is within the permissible pitch range, in which the coordinate is located at a shortest distance from the first determination point.

The image data can be obtained by converting vector data for the line pattern by using a Bresenham's algorithm. Moreover, the first base point and the first determination point can be separated by r from one side of the image data for the line pattern.

If the distance between the first base point and the first determination point is outside the permissible pitch range, the first determination point can be moved in a direction parallel to one side of the image data for the line pattern, and the determining of whether the distance between the first base point and the first determination point is within the permissible pitch range can be repeated.

After the storing of the coordinate located at the shortest distance from the first determination point as print data, the method can include arranging the stored coordinate as a second base point, selecting a second determination point, in which the second determination point is separated from the second base point and parallel to one side of the image data for the line pattern, determining whether a distance between the second base point and the second determination point is within the permissible pitch range, and storing a coordinate as print data if the distance between the second base point and the second determination point is within the permissible pitch range, in which the coordinate is located at a shortest distance from the second determination point.

Before the obtaining of the image data, a width of the image data for the line pattern can be divided into a plurality of sections, and the selecting of the first base point and the storing of the coordinate as print data can be performed for each of the plurality of sections.

Here, a width of a section positioned at an outermost end of the plurality of sections can be r, and the sections positioned at an inner side of the plurality of sections can have a same width.

Additional aspects and advantages of the present invention will be set forth in part in the description which follows, and in part will be obvious from the description, or may be learned by practice of the invention.

DETAILED DESCRIPTION

Figure 1:
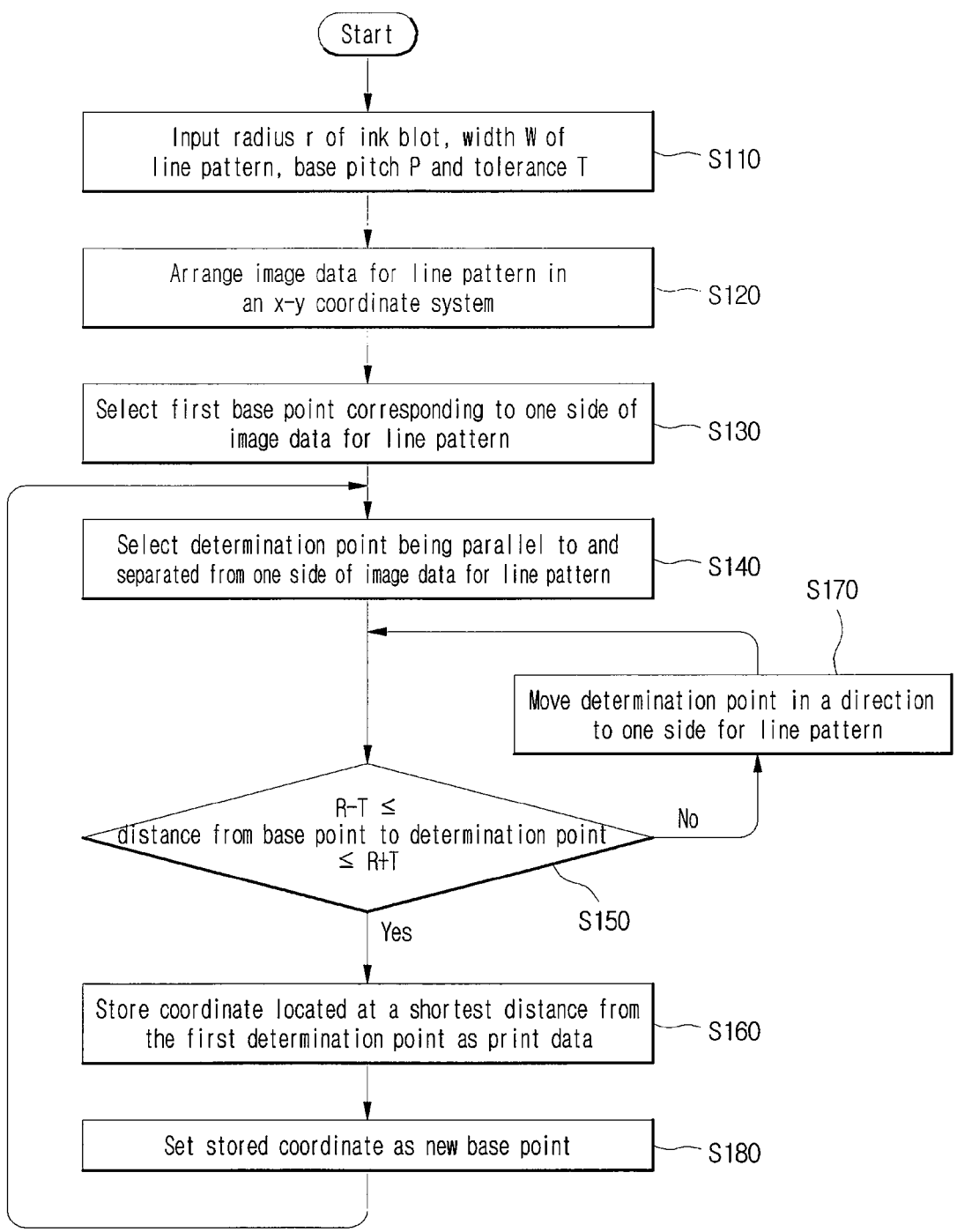
FIG. 1 is a flowchart illustrating a method of processing image data in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A method of processing image data and a recorded medium tangibly embodying the method in accordance with certain embodiments of the present invention will be described below in more detail with reference to the accompanying drawings. Those components that are the same or are in correspondence are rendered the same reference numeral regardless of the figure number, and redundant descriptions are omitted.

Figure 2:
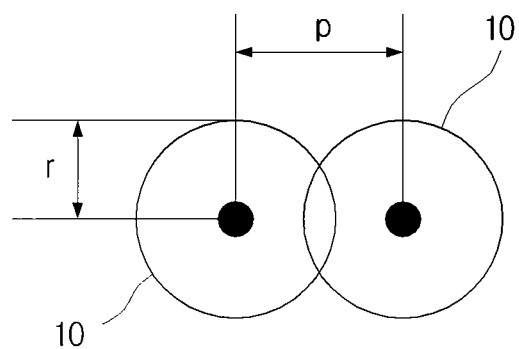
FIG. 2 is a plan view illustrating an ink blot formed in an overlapping manner.

FIG. 1 is a flowchart illustrating a method of processing image data in accordance with an embodiment of the present invention, and FIG. 2 is a plan view illustrating an ink blot formed in an overlapping manner. FIGS. 3 to 8 are flow diagrams illustrating a method of processing image data in accordance with an embodiment of the present invention.

First of all, a width W of a line pattern to be printed, a radius r of an ink blot to be ejected, base pitch P as a basis for a degree of the ejected ink blots in an overlapping manner, and tolerance T can be set and inputted (S110).

Here, as illustrated in FIG. 2, the radius r of the ink blot 10 means a radius of a circular mark formed as an ink 10 hits a substrate, etc., not a radius of a spherical ink droplet before it hits the substrate, etc.

The pitch here means a distance between the center points of ink blots 10 that are formed in a partially overlapping manner, as illustrated in FIG. 2. The base pitch P can be set by the designer.

Figure 3:
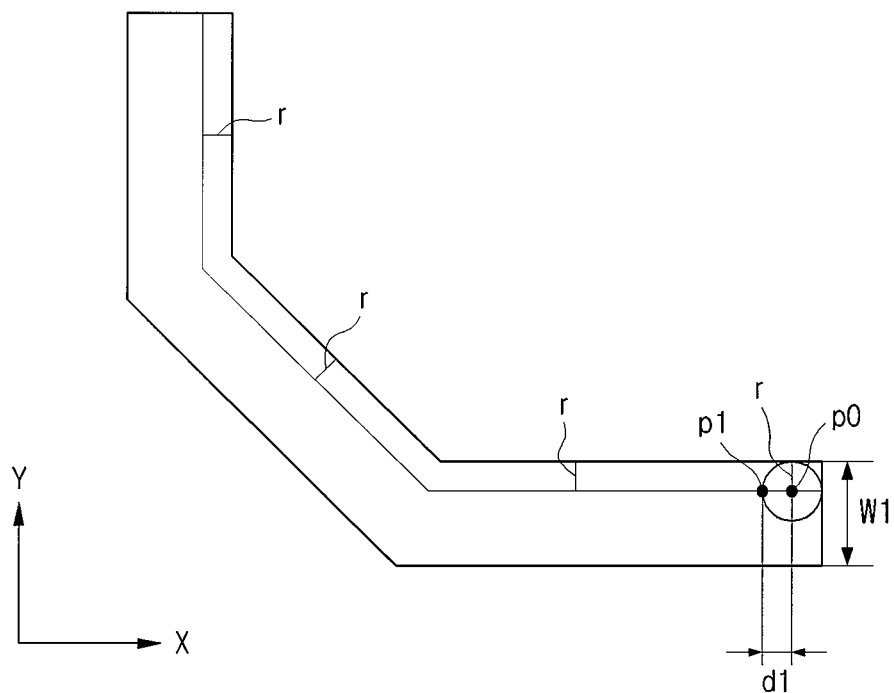
FIGS. 3 to 8 are flow diagrams illustrating a method of processing image data in accordance with an embodiment of the present invention.

After that, as illustrated in FIG. 3, image data about the line pattern to be printed can be arranged in an x-y coordinate system (S120). The x-y coordinate system can be set with various values of unit distance at the discretion of the designer in accordance with desired resolution (dpi). The image data for the line pattern can be vector data, i.e. Gerber data, or data converted from the vector data by using Bresenham's algorithm.

And then, as illustrated in FIG. 3, a base point p0 corresponding to one side of the image data of the line pattern is selected (S130). The base point p0 is selected at a point a slight distance apart from one side of the image data of the line pattern, taking a size of an ink bolt to be printed into consideration. Thus, the base point p0 can be stored as print data.

Here, the base point p0 can be separated from one side of the image data of the line pattern by a radius r of an ink blot, as illustrated in FIG. 3. By selecting the base point p0 at a point separated by r from one side of the image data of the line pattern, an effect of an ink blot being spread beyond the boundary of the line pattern can be eliminated, when the ink blot is ejected on the point.

After that, a determination point (p1 in FIG. 3, p2 in FIG. 4) that is separated from and parallel to one side of the image data for the line pattern can be selected as a point from the base point p0 (S140). The determination point p1 can be selected at a point a slight distance apart from one side of the image data for the line pattern, taking a size of an ink blot to be printed into consideration. It shall be evident that, like the base point p0, the determination point (p1, p2) can be selected at a point separated by a radius r of the ink blot from one side of the image data of the line pattern.

After selecting the base point p0 and the determination point (p1, p2), it is determined that whether a distance between the base point p0 and the determination point (p1, p2) is within a permissible pitch range (S150). Here, the permissible pitch range means a value ranging from P−T to P+T, which reflects tolerance T to the base pitch P as inspired by the designer.

The circle in FIG. 3 can represent a simulated ink blot taking into consideration a size of an ink droplet ejected from an inkjet head.

Figure 4:
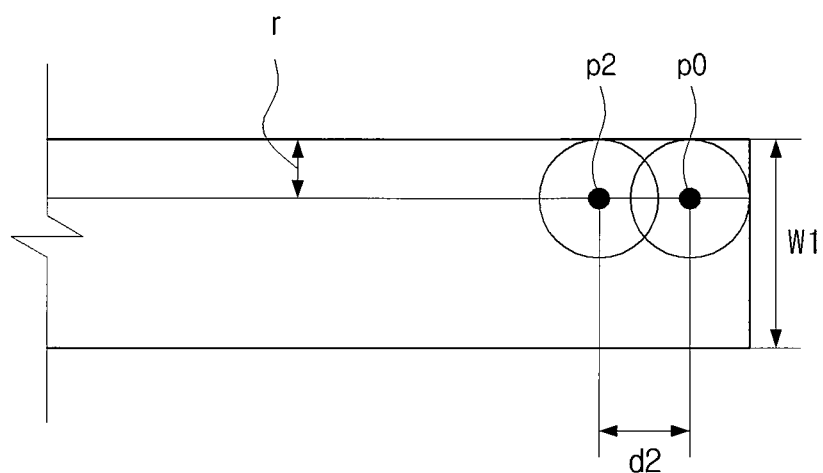

When determining, if the distance between the base point p0 and the determination point is within the permissible pitch range in case of FIG. 4, a coordinate located at a shortest distance from the determination point p2 can be stored as print data (S160).

Figure 5:
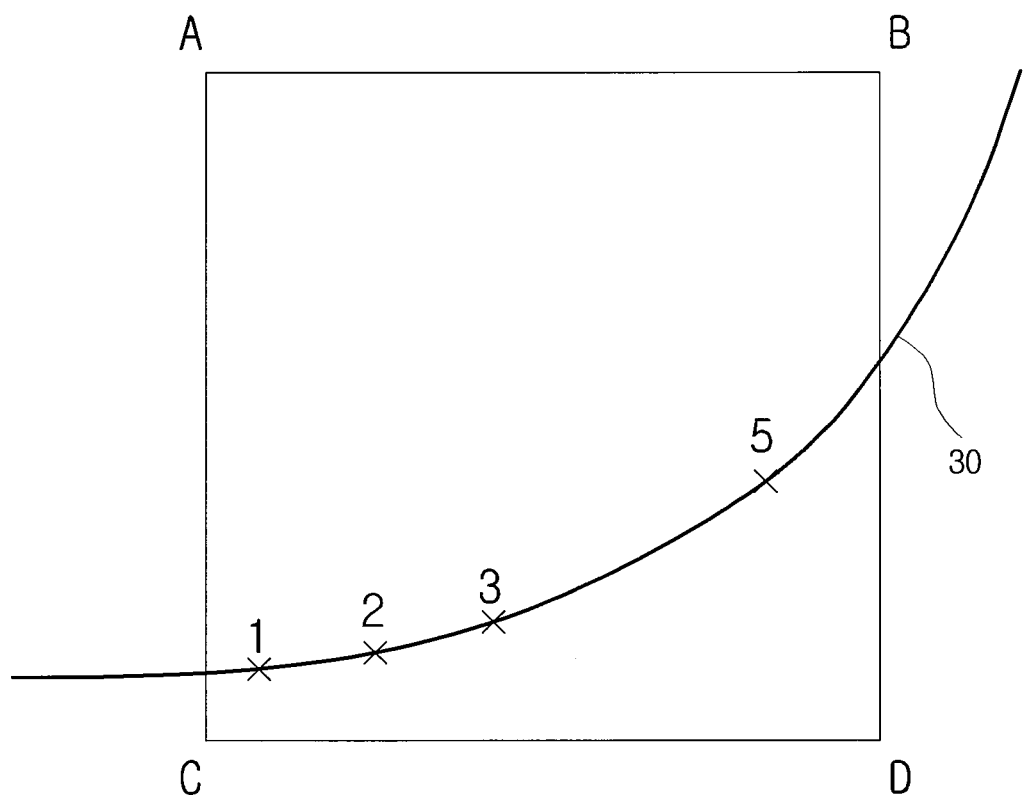

If the image data of the line pattern is vector data, some of the vector data can be not located on any of coordinates A, B, C and D in an x-y coordinate system, as illustrated in FIG. 5. That is, the determination point can be located on any of coordinates 1, 2, 3 and 5, but not on any of the coordinates A, B, C and D.

Unlike the vector data, print data for printing an inkjet may have to be stored in a raster data format, i.e. bitmap data. Therefore, in case the determination point is located on any of the coordinates 1, 2, 3 and 5, any of the coordinates A, B, C and D can be stored as print data.

A method of selecting a coordinate located at a shortest distance from the determination point is to select any of the four coordinates, which has the shortest distance from the determination point to each of the four coordinates by analyzing mathematically.

If the determination point is located on any of the coordinates in an x-y coordinate system, the coordinate can be stored as print data.

On the other hand, if the distance from the base point p0 to the determination point is beyond the permissible pitch range in case of FIG. 3, the determination point p1 can be moved in a direction parallel to one side of the image data of the line pattern (S170). And then, whether the distance between the base point p0 and the determination point is within the permissible pitch range can be determined (S150). Here, p2 illustrated in FIG. 4 indicates a point that has moved in a direction parallel to one side of the image data of the line pattern from p1 illustrated in FIG. 3.

Figure 6:
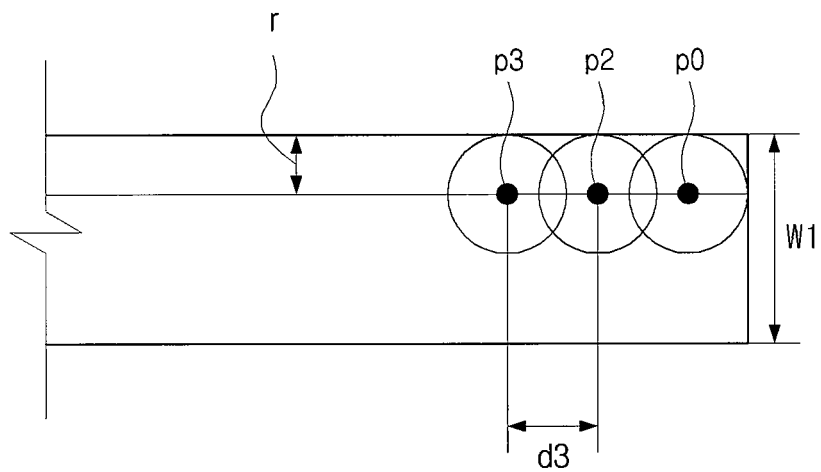

After such processes above, a coordinate of p2 stored as print data can be selected as a new base point, as illustrated in FIG. 6 (S180). After that, a new determination point p3 can be selected from the coordinate of p2 (S140), and then the processes described above can be repeated.

That is, whether a distance between the new base point p2 and the new determination point p3 is within the permissible pitch range can be determined (S150), and if the distance is within the permissible pitch range, a coordinate located at a shortest distance from the determination point p3 can be stored as additional print data (S160).

By repeating the processes above, all print data for printing one side of the line pattern can be completely stored, and then print data for printing the other side of the line pattern can be stored by repeating the same processes above, thus storing all print data for printing the entire line pattern.

Figure 7:
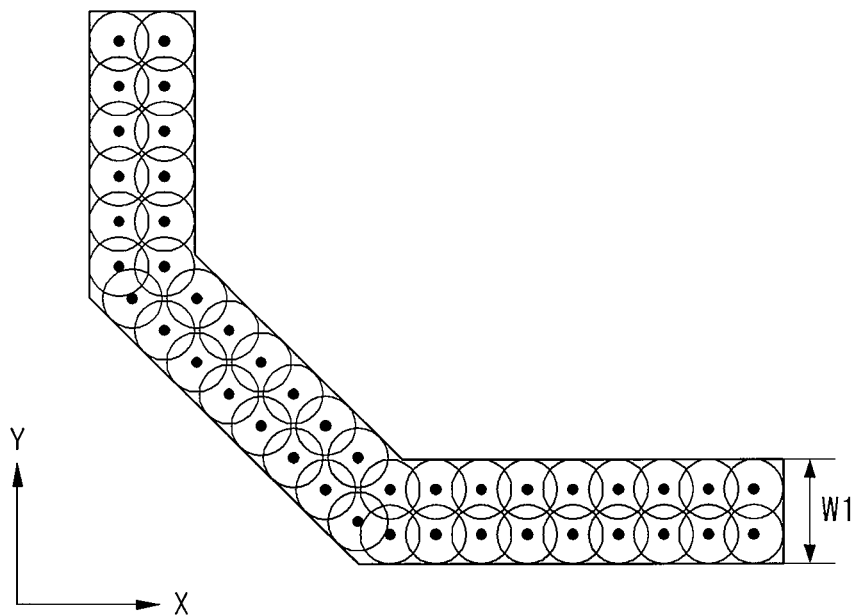
Figure 8:
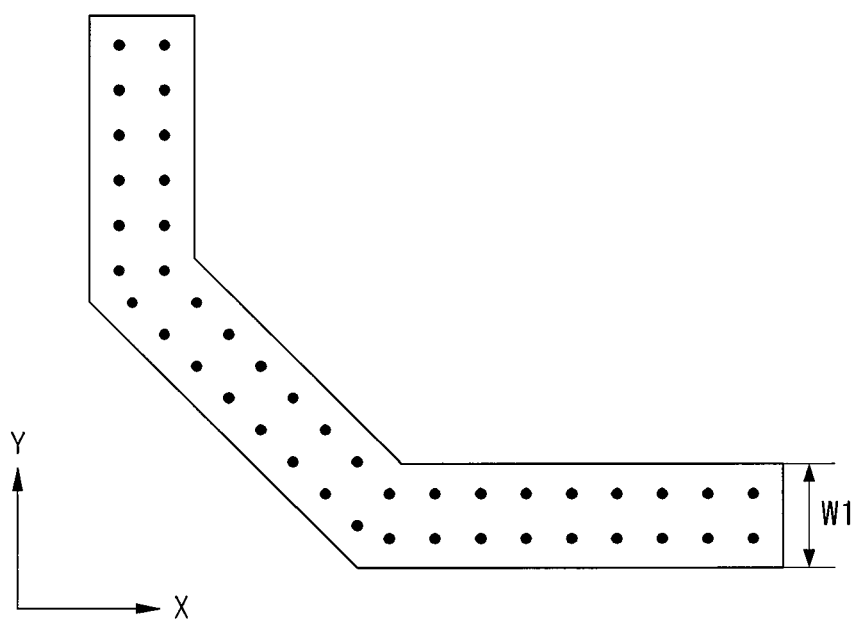

All print data for printing the entire line pattern can be completely stored, as illustrated in FIGS. 7 and 8. Dots illustrated in FIGS. 7 and 8 show spots on which ink blots may be ejected from the inkjet head.

Figure 9:
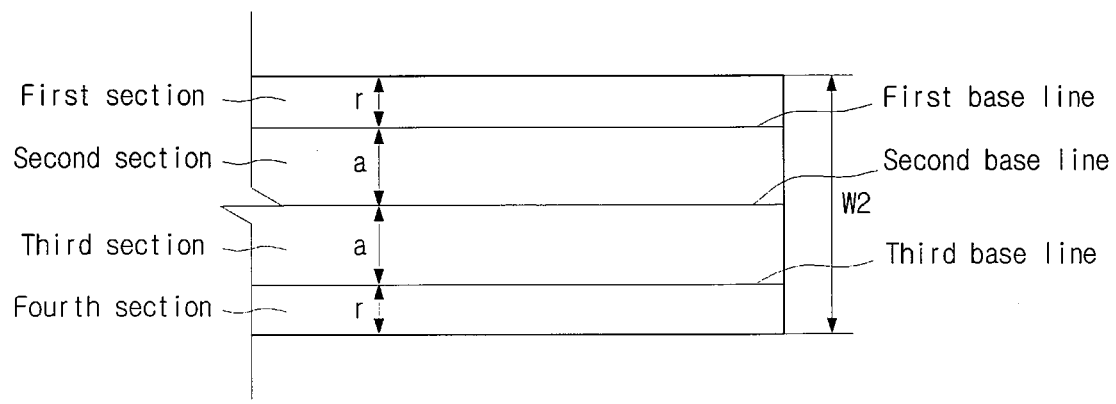
FIGS. 9 to 11 are flow diagrams illustrating a method of processing image data in accordance with another embodiment of the present invention.
Figure 10:
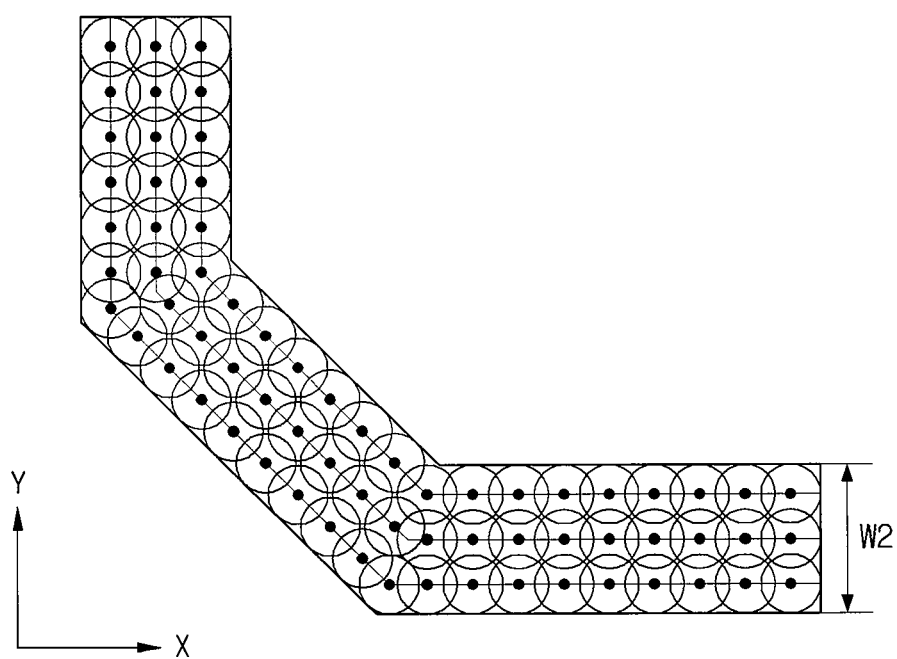
Figure 11:
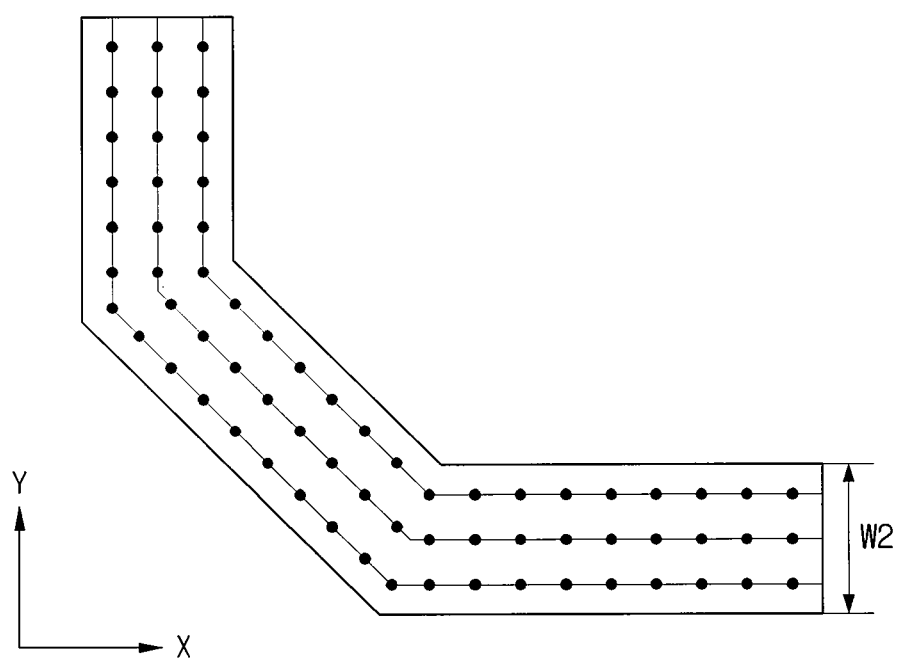

Next, another embodiment of the present invention provides a method of processing image data with reference to FIGS. 9 to 11. However, certain detailed explanations of the described embodiments are omitted, when it is repeated, and the difference is mainly described.

As illustrated in FIG. 9, a method of processing image data in accordance with another embodiment of the present embodiment can be characterized by dividing a width of the image data for the line pattern into a plurality of sections and storing print data for printing the line pattern from each divided section.

That is, as illustrated in FIGS. 9 to 11, if a width W2 of the image data of the line pattern is greater than twice the size 4r of a diameter of the ink bolt, more specifically, greater than a value 4r−P−T that represents twice the size 4r of a diameter of the ink bolt subtracting a minimum value P−T of the permissible pitch range, all print data for printing the line pattern cannot be completely stored by just storing the print data from one side and the other side of the line pattern, like the case of the previously described embodiment of the present invention.

By considering such a point described above, the image data of the line pattern can be divided into four sections by using three base lines, as illustrated in FIG. 9.

As illustrated in FIG. 9, among a plurality of sections, a width of a first section and a fourth section placed on an outermost side can be set to a radius r of an ink blot. That is, as illustrated in FIG. 9, a distance between an uppermost side of the image data of the line pattern and a first base line and a distance between a bottommost side of the image data of the line pattern and a third base line can be r.

While a width of the sections located on the outmost side is r, an effect of an ink blot being spread beyond the boundary of the line pattern can be eliminated, when the ink blot is ejected on the first base line or the third base line.

Furthermore, as illustrated in FIG. 9, a width of a second section and a third section placed on an inner side can have the same width. That is, as illustrated in FIG. 9, a distance between the first base line and a second base line and a distance between the third base line and the second base line can have the same value a. While a width of the sections located on the inner side has the same value a, the line pattern with a uniform density of ink can be implemented.

As such, the image data of the line pattern can be divided into a plurality of sections. Then, all print data for printing the line pattern having a wide width can be efficiently stored by obtaining print data from the sections divided by the base lines.

The method of obtaining print data from each section is the same as the previously described embodiment of the present invention, so that detailed explanations will be omitted hereinafter.

Through such processes described above, all print data for printing the entire line pattern having a wide width can be completely stored, as illustrated in FIGS. 10 and 11. Dots illustrated in FIGS. 10 and 11 show spots on which ink blots may be ejected from the inkjet head.

Generalized and detailed aspects of the method of processing image data, as disclosed using the present embodiments, can be tangibly implemented as a recorded medium readable by a computer, etc., that stores a program of instructions executable by the computer, etc.

Detailed explanations in each process may be substantially the same as that described above, and thus redundant descriptions will be omitted.

By utilizing certain embodiments of the present invention as set forth above, a pad can be printed with a high level of surface smoothness and high reliability to satisfy the resolution and ink density requirements needed by the user.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A method of processing image data to obtain image data for printing a line pattern by discharging ink blots in an overlapping manner, each of the ink blots having a radius of r, the method comprising steps of:

setting a permissible pitch range for a distance between adjacent ink blots;

arranging image data for the line pattern in an x-y coordinate system having a plurality of coordinates;

selecting a first base point that corresponds to one side of the image data for the line pattern;

selecting a first determination point separated from the first base point in a direction parallel to the one side of the image data for the line pattern, the first determination point being separated from the one side of the image data for the line pattern;

determining whether a distance between the first base point and the first determination point is within the permissible pitch range;

storing a coordinate, among the plurality of coordinates, located at a shortest distance from the first determination point as print data when it is determined that the distance between the first base point and the first determination point is within the permissible pitch range, wherein the permissible pitch range ranges from a base pitch subtracted by a tolerance to the base pitch added with the tolerance; and when it is determined that the distance between the first base point and the first determination point is outside the permissible pitch range, relocating the first determination point in a direction parallel to the one side of the image data for the line pattern and determining whether the distance between the first base point and the relocated first determination point is within the permissible pitch range.

2. The method of claim 1, wherein the image data is obtained by converting vector data for the line pattern by using a Bresenham's algorithm.

3. The method of claim 1, wherein the first base point and the first determination point are separated by r from the one side of the image data for the line pattern.

4. The method of claim 1, further comprising the steps of, after the step of storing the coordinate, among the plurality of the coordinates, located at the shortest distance from the first determination point as print data:

arranging the stored coordinate as a second base point;

selecting a second determination point separated from the second base point in a direction parallel to the one side of the image data for the line pattern;

determining whether a distance between the second base point and the second determination point is within the permissible pitch range; and storing another coordinate, among the plurality of the coordinates, located at a shortest distance from the second determination point as print data when it is determined that the distance between the second base point and the second determination point is within the permissible pitch range.

5. The method of claim 1, wherein:
a width of the image data for the line pattern is divided into a plurality of sections; and
the step of selecting the first base point and the step of storing of the coordinate as print data are performed for each of the plurality of sections.

6. The method of claim 5, wherein a width of a section positioned at an outermost end of the plurality of sections is r.

7. The method of claim 6, wherein sections positioned at an inner side of the plurality of sections have a same width.

8. A non-transitory recorded medium tangibly embodying a program of instructions for performing a method of processing image data to obtain image data for printing a line pattern by discharging ink blots, each of the ink blots having a radius of r overlapping manner, the method comprising steps of:
setting a permissible pitch range for a distance between adjacent ink blots;
arranging image data for the line pattern in an x-y coordinate system having a plurality of coordinates;
selecting a first base point that corresponds to one side of the image data for the line pattern;
selecting a first determination point separated from the first base point in a direction parallel to the one side of the image data for the line pattern, the first determination point being separated from one side of the image data for the line pattern;
determining whether a distance between the first base point and the first determination point is within the permissible pitch range;
storing a coordinate, among the plurality of coordinates, located at a shortest distance from the first determination point as print data when it is determined that the distance between the first base point and the first determination point is within the permissible pitch range, wherein the permissible pitch range ranges from a base pitch subtracted by a tolerance to the base pitch added with the tolerance;
the method further comprising steps of, after the step of storing the coordinate, among the plurality of coordinates, located at the shortest distance from the first determination point as print data:
arranging the stored coordinate as a second base point;
selecting a second determination point separated from the second base point in a direction parallel to the one side of the image data for the line pattern;
determining whether a distance between the second base point and the second determination point is within the permissible pitch range; and
storing another coordinate, among the plurality of coordinates, located at a shortest distance from the second determination point as print data when it is determined that the distance between the second base point and the second determination point is within the permissible pitch range.

9. The recorded medium of claim 8, wherein the image data is obtained by converting vector data for the line pattern by using a Bresenham's algorithm.

10. The recorded medium of claim 8, wherein the first base point and the first determination point are separated by r from the one side of the image data for the line pattern.

11. The recorded medium of claim 8, further comprising the step of:
when it is determined that the distance between the first base point and the first determination point is outside the permissible pitch range, relocating the first determination point in a direction parallel to the one side of the image data for the line pattern and determining whether the distance between the first base point and the relocated first determination point is within the permissible pitch range.

12. The recorded medium of claim 8, wherein:
a width of the image data for the line pattern is divided into a plurality of sections; and
the step of selecting the first base point and the step of storing the coordinate as print data are performed for each of the plurality of sections.

13. The recorded medium of claim 12, wherein a width of a section positioned at an outermost end of the plurality of sections is r.

14. The recorded medium of claim 13, wherein sections positioned at an inner side of the plurality of sections have a same width.

* * * * *